United States Patent
Lung

(10) Patent No.: US 7,569,844 B2
(45) Date of Patent: Aug. 4, 2009

(54) MEMORY CELL SIDEWALL CONTACTING SIDE ELECTRODE

(75) Inventor: Hsiang-Lan Lung, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 149 days.

(21) Appl. No.: 11/736,384

(22) Filed: Apr. 17, 2007

(65) Prior Publication Data

US 2008/0258126 A1    Oct. 23, 2008

(51) Int. Cl.
*H01L 29/02* (2006.01)
*H01L 21/00* (2006.01)
*G11C 11/56* (2006.01)

(52) U.S. Cl. ............ 257/2; 257/4; 257/5; 257/E21.613; 438/800; 438/900; 365/148; 365/163

(58) Field of Classification Search ............... 257/2, 257/4, 5, E21.613; 438/900; 365/148, 163
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,452,592 A | 6/1984 | Tsai | |
| 4,599,705 A | 7/1986 | Holmberg et al. | |
| 4,719,594 A | 1/1988 | Young et al. | |
| 4,769,339 A | 9/1988 | Ishii et al. | |
| 4,876,220 A | 10/1989 | Mohsen et al. | |
| 4,959,812 A | 9/1990 | Momodomi et al. | |
| 5,106,775 A | 4/1992 | Kaga et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,332,923 A | 7/1994 | Takeuchi et al. | |

(Continued)

FOREIGN PATENT DOCUMENTS

WO    0079539    12/2000

(Continued)

OTHER PUBLICATIONS

Atwood, G, et al., "90nm Phase Change Technology with mTrench and Lance Cell Elements," VLSI Technology, Systems and Applications, Apr. 23-25, 2007, pp. 1-2.

(Continued)

*Primary Examiner*—Evan Pert
*Assistant Examiner*—Scott R Wilson
(74) *Attorney, Agent, or Firm*—James F. Hann; Haynes Beffell & Wolfeld LLP

(57) ABSTRACT

A memory cell includes a memory cell layer over a memory cell access layer. The memory cell access layer comprises a bottom electrode. The memory cell layer comprises a dielectric layer and a side electrode at least partially defining a void with a memory element therein. The memory element comprises a memory material switchable between electrical property states by the application of energy. The memory element is in electrical contact with the side electrode and with the bottom electrode. In some examples the memory element has a pillar shape with a generally constant lateral dimension with the side electrode and the dielectric layer surrounding and in contact with first and second portions of the memory element.

19 Claims, 9 Drawing Sheets

U.S. PATENT DOCUMENTS

| | | | |
|---|---|---|---|
| 5,391,901 A | 2/1995 | Tanabe et al. | |
| 5,515,488 A | 5/1996 | Stephens, Jr. | |
| 5,534,712 A | 7/1996 | Ovshinsky et al. | |
| 5,550,396 A | 8/1996 | Tsutsumi et al. | |
| 5,687,112 A | 11/1997 | Ovshinsky | |
| 5,688,713 A | 11/1997 | Linliu et al. | |
| 5,716,883 A | 2/1998 | Tseng et al. | |
| 5,754,472 A | 5/1998 | Sim et al. | |
| 5,789,277 A | 8/1998 | Zahorik et al. | |
| 5,789,758 A | 8/1998 | Reinberg | |
| 5,814,527 A | 9/1998 | Wolstenholme et al. | |
| 5,831,276 A | 11/1998 | Gonzalez et al. | |
| 5,837,564 A | 11/1998 | Sandhu et al. | |
| 5,869,843 A | 2/1999 | Harshfield | |
| 5,879,955 A | 3/1999 | Gonzalez et al. | |
| 5,902,704 A | 5/1999 | Schoenborn et al. | |
| 5,920,788 A | 7/1999 | Reinberg | |
| 5,933,365 A | 8/1999 | Klersy et al. | |
| 5,952,671 A | 9/1999 | Reinberg et al. | |
| 5,958,358 A | 9/1999 | Tenne et al. | |
| 5,970,336 A | 10/1999 | Wolstenholme et al. | |
| 5,985,698 A | 11/1999 | Gonzalez et al. | |
| 5,998,244 A | 12/1999 | Wolstenholme et al. | |
| 6,011,725 A | 1/2000 | Eitan et al. | |
| 6,025,220 A | 2/2000 | Sandhu | |
| 6,031,287 A | 2/2000 | Harshfield | |
| 6,034,882 A | 3/2000 | Johnson et al. | |
| 6,046,951 A | 4/2000 | El Hajji et al. | |
| 6,066,870 A | 5/2000 | Siek | |
| 6,077,674 A | 6/2000 | Schleifer et al. | |
| 6,077,729 A | 6/2000 | Harshfield | |
| 6,087,269 A | 7/2000 | Williams | |
| 6,087,674 A | 7/2000 | Ovshinsky et al. | |
| 6,104,038 A | 8/2000 | Gonzalez et al. | |
| 6,111,264 A | 8/2000 | Wolstenholme et al. | |
| 6,114,713 A | 9/2000 | Zahorik | |
| 6,117,720 A | 9/2000 | Harshfield | |
| 6,147,395 A | 11/2000 | Gilgen | |
| 6,150,253 A | 11/2000 | Doan et al. | |
| 6,153,890 A | 11/2000 | Wolstenholme et al. | |
| 6,177,317 B1 | 1/2001 | Huang et al. | |
| 6,185,122 B1 | 2/2001 | Johnson et al. | |
| 6,189,582 B1 | 2/2001 | Reinberg et al. | |
| 6,236,059 B1 | 5/2001 | Wolstenholme et al. | |
| RE37,259 E | 7/2001 | Ovshinsky | |
| 6,271,090 B1 | 8/2001 | Huang et al. | |
| 6,280,684 B1 | 8/2001 | Yamada et al. | |
| 6,287,887 B1 | 9/2001 | Gilgen | |
| 6,291,137 B1 | 9/2001 | Lyons et al. | |
| 6,314,014 B1 | 11/2001 | Lowrey et al. | |
| 6,316,348 B1 | 11/2001 | Fu et al. | |
| 6,320,786 B1 | 11/2001 | Chang et al. | |
| 6,326,307 B1 | 12/2001 | Lindley et al. | |
| 6,339,544 B1 | 1/2002 | Chiang et al. | |
| 6,351,406 B1 | 2/2002 | Johnson et al. | |
| 6,372,651 B1 | 4/2002 | Yang et al. | |
| 6,380,068 B2 | 4/2002 | Jeng et al. | |
| 6,420,215 B1 | 7/2002 | Knall et al. | |
| 6,420,216 B1 | 7/2002 | Clevenger et al. | |
| 6,420,725 B1 | 7/2002 | Harshfield | |
| 6,423,621 B2 | 7/2002 | Doan et al. | |
| 6,429,064 B1 | 8/2002 | Wicker | |
| 6,440,837 B1 | 8/2002 | Harshfield | |
| 6,462,353 B1 | 10/2002 | Gilgen | |
| 6,483,736 B2 | 11/2002 | Johnson et al. | |
| 6,487,114 B2 | 11/2002 | Jong et al. | |
| 6,501,111 B1 | 12/2002 | Lowrey | |
| 6,511,867 B2 | 1/2003 | Lowrey et al. | |
| 6,512,241 B1 | 1/2003 | Lai | |
| 6,514,788 B2 | 2/2003 | Quinn | |
| 6,514,820 B2 | 2/2003 | Ahn et al. | |
| 6,534,781 B2 | 3/2003 | Dennison | |
| 6,545,903 B1 | 4/2003 | Wu | |
| 6,551,866 B1 | 4/2003 | Maeda et al. | |
| 6,555,860 B2 | 4/2003 | Lowrey et al. | |
| 6,563,156 B2 | 5/2003 | Harshfield | |
| 6,566,700 B2 | 5/2003 | Xu | |
| 6,567,293 B1 | 5/2003 | Lowrey et al. | |
| 6,576,546 B2 | 6/2003 | Gilbert et al. | |
| 6,579,760 B1 | 6/2003 | Lung et al. | |
| 6,586,761 B2 | 7/2003 | Lowrey | |
| 6,589,714 B2 | 7/2003 | Maimon et al. | |
| 6,593,176 B2 | 7/2003 | Dennison | |
| 6,596,589 B2 | 7/2003 | Tseng et al. | |
| 6,597,009 B2 | 7/2003 | Wicker | |
| 6,605,527 B2 | 8/2003 | Dennison et al. | |
| 6,605,821 B1 | 8/2003 | Lee et al. | |
| 6,607,974 B2 | 8/2003 | Harshfield | |
| 6,613,604 B2 | 9/2003 | Maimon et al. | |
| 6,617,192 B1 | 9/2003 | Lowrey et al. | |
| 6,621,095 B2 | 9/2003 | Chiang et al. | |
| 6,627,530 B2 | 9/2003 | Li et al. | |
| 6,639,849 B2 | 10/2003 | Takahashi et al. | |
| 6,673,700 B2 | 1/2004 | Dennison et al. | |
| 6,674,115 B2 | 1/2004 | Hudgens et al. | |
| 6,677,678 B2 | 1/2004 | Biolsi et al. | |
| 6,744,088 B1 | 6/2004 | Dennison | |
| 6,750,079 B2 | 6/2004 | Lowrey et al. | |
| 6,750,101 B2 | 6/2004 | Lung et al. | |
| 6,791,102 B2 | 9/2004 | Johnson et al. | |
| 6,797,979 B2 | 9/2004 | Chiang et al. | |
| 6,800,504 B2 | 10/2004 | Li et al. | |
| 6,800,563 B2 | 10/2004 | Xu | |
| 6,805,563 B2 | 10/2004 | Ohashi et al. | |
| 6,815,704 B1 | 11/2004 | Chen | |
| 6,830,952 B2 | 12/2004 | Lung et al. | |
| 6,838,692 B1 | 1/2005 | Lung et al. | |
| 6,850,432 B2 | 2/2005 | Lu et al. | |
| 6,859,389 B2 | 2/2005 | Idehara et al. | |
| 6,861,267 B2 | 3/2005 | Xu et al. | |
| 6,864,500 B2 | 3/2005 | Gilton | |
| 6,864,503 B2 | 3/2005 | Lung et al. | |
| 6,867,638 B2 | 3/2005 | Saiki et al. | |
| 6,881,603 B2 | 4/2005 | Lai | |
| 6,888,750 B2 | 5/2005 | Walker et al. | |
| 6,894,304 B2 | 5/2005 | Moore | |
| 6,894,305 B2 | 5/2005 | Yi et al. | |
| 6,900,517 B2 | 5/2005 | Tanaka et al. | |
| 6,903,362 B2 | 6/2005 | Wyeth et al. | |
| 6,909,107 B2 | 6/2005 | Rodgers et al. | |
| 6,910,907 B2 | 6/2005 | Layadi et al. | |
| 6,927,410 B2 | 8/2005 | Chen | |
| 6,928,022 B2 | 8/2005 | Cho et al. | |
| 6,933,516 B2 | 8/2005 | Xu | |
| 6,936,544 B2 | 8/2005 | Huang et al. | |
| 6,936,840 B2 | 8/2005 | Sun et al. | |
| 6,937,507 B2 | 8/2005 | Chen | |
| 6,943,365 B2 | 9/2005 | Lowrey et al. | |
| 6,969,866 B1 | 11/2005 | Lowrey et al. | |
| 6,972,428 B2 | 12/2005 | Maimon | |
| 6,972,430 B2 | 12/2005 | Casagrande et al. | |
| 6,977,181 B1 | 12/2005 | Raberg et al. | |
| 6,992,932 B2 | 1/2006 | Cohen et al. | |
| 7,023,009 B2 | 4/2006 | Kostylev et al. | |
| 7,033,856 B2 | 4/2006 | Lung et al. | |
| 7,038,230 B2 | 5/2006 | Chen et al. | |
| 7,038,938 B2 | 5/2006 | Kang et al. | |
| 7,042,001 B2 | 5/2006 | Kim et al. | |
| 7,054,183 B2 | 5/2006 | Rinerson et al. | |
| 7,067,837 B2 | 6/2006 | Hwang et al. | |
| 7,067,864 B2 | 6/2006 | Nishida et al. | |
| 7,067,865 B2 | 6/2006 | Lung et al. | |
| 7,078,273 B2 | 7/2006 | Matsuoka et al. | |
| 7,099,180 B1 | 8/2006 | Dodge et al. | |

| | | | | | | |
|---|---|---|---|---|---|---|
| 7,115,927 B2 | 10/2006 | Hideki et al. | | 2006/0113520 A1 | 6/2006 | Yamamoto et al. |
| 7,122,281 B2 | 10/2006 | Pierrat | | 2006/0113521 A1 | 6/2006 | Lung |
| 7,122,824 B2 | 10/2006 | Khouri et al. | | 2006/0118913 A1 | 6/2006 | Yi et al. |
| 7,126,149 B2 | 10/2006 | Iwasaki et al. | | 2006/0124916 A1 | 6/2006 | Lung |
| 7,132,675 B2 | 11/2006 | Gilton | | 2006/0126395 A1 | 6/2006 | Chen et al. |
| 7,154,774 B2 | 12/2006 | Bedeschi et al. | | 2006/0131555 A1 | 6/2006 | Liu et al. |
| 7,164,147 B2 | 1/2007 | Lee et al. | | 2006/0138467 A1 | 6/2006 | Lung |
| 7,166,533 B2 | 1/2007 | Happ | | 2006/0154185 A1 | 7/2006 | Ho et al. |
| 7,169,635 B2 | 1/2007 | Kozicki | | 2006/0157681 A1 | 7/2006 | Chen et al. |
| 7,202,493 B2 | 4/2007 | Lung et al. | | 2006/0163554 A1 | 7/2006 | Lankhorst et al. |
| 7,208,751 B2 | 4/2007 | Ooishi et al. | | 2006/0198183 A1 | 9/2006 | Kawahara et al. |
| 7,214,958 B2 | 5/2007 | Happ | | 2006/0205108 A1 | 9/2006 | Maimon et al. |
| 7,220,983 B2 | 5/2007 | Lung | | 2006/0211165 A1 | 9/2006 | Hwang et al. |
| 7,229,883 B2 | 6/2007 | Wang et al. | | 2006/0226409 A1 | 10/2006 | Burr et al. |
| 7,238,959 B2 | 7/2007 | Chen | | 2006/0234138 A1 | 10/2006 | Fehlhaber et al. |
| 7,238,994 B2 | 7/2007 | Chen et al. | | 2006/0237756 A1 | 10/2006 | Park et al. |
| 7,248,494 B2 | 7/2007 | Oh et al. | | 2006/0266993 A1 | 11/2006 | Suh et al. |
| 7,251,157 B2 | 7/2007 | Osada et al. | | 2006/0284157 A1 | 12/2006 | Chen et al. |
| 7,253,429 B2 | 8/2007 | Klersy et al. | | 2006/0284158 A1 | 12/2006 | Lung et al. |
| 7,254,059 B2 | 8/2007 | Li et al. | | 2006/0284214 A1 | 12/2006 | Chen |
| 7,269,052 B2 | 9/2007 | Segal et al. | | 2006/0284279 A1 | 12/2006 | Lung et al. |
| 7,277,317 B2 | 10/2007 | Le Phan et al. | | 2006/0286709 A1 | 12/2006 | Lung et al. |
| 7,291,556 B2 | 11/2007 | Choi et al. | | 2006/0286743 A1 | 12/2006 | Lung et al. |
| 7,309,630 B2 | 12/2007 | Fan et al. | | 2006/0289848 A1 | 12/2006 | Dennison |
| 7,321,130 B2 | 1/2008 | Lung et al. | | 2007/0008786 A1 | 1/2007 | Scheuerlein |
| 7,323,708 B2 | 1/2008 | Lee et al. | | 2007/0030721 A1 | 2/2007 | Segal et al. |
| 7,332,370 B2 | 2/2008 | Chang et al. | | 2007/0037101 A1 | 2/2007 | Morioka |
| 7,336,526 B2 | 2/2008 | Osada et al. | | 2007/0096162 A1 | 5/2007 | Happ et al. |
| 7,351,648 B2 | 4/2008 | Furukawa et al. | | 2007/0096248 A1 | 5/2007 | Philipp et al. |
| 7,359,231 B2 | 4/2008 | Venkataraman et al. | | 2007/0108077 A1 | 5/2007 | Lung et al. |
| 7,364,935 B2 | 4/2008 | Lung et al. | | 2007/0108429 A1 | 5/2007 | Lung |
| 7,365,385 B2 | 4/2008 | Abbott | | 2007/0108430 A1 | 5/2007 | Lung |
| 7,379,328 B2 | 5/2008 | Osada et al. | | 2007/0108431 A1 | 5/2007 | Chen et al. |
| 7,385,235 B2 | 6/2008 | Lung et al. | | 2007/0109836 A1 | 5/2007 | Lung |
| 7,394,088 B2 | 7/2008 | Lung | | 2007/0109843 A1 | 5/2007 | Lung et al. |
| 7,397,060 B2 | 7/2008 | Lung | | 2007/0111429 A1 | 5/2007 | Lung |
| 7,423,300 B2 | 9/2008 | Lung et al. | | 2007/0115794 A1 | 5/2007 | Lung |
| 7,426,134 B2 | 9/2008 | Happ et al. | | 2007/0117315 A1 | 5/2007 | Lai et al. |
| 7,440,308 B2 | 10/2008 | Jeong et al. | | 2007/0121363 A1 | 5/2007 | Lung |
| 7,449,710 B2 | 11/2008 | Lung | | 2007/0121374 A1 | 5/2007 | Lung et al. |
| 2002/0070457 A1 | 6/2002 | Sun et al. | | 2007/0126040 A1 | 6/2007 | Lung |
| 2002/0113273 A1 | 8/2002 | Hwang et al. | | 2007/0131922 A1 | 6/2007 | Lung |
| 2003/0072195 A1 | 4/2003 | Mikolajick | | 2007/0131980 A1 | 6/2007 | Lung |
| 2003/0095426 A1 | 5/2003 | Hush et al. | | 2007/0138458 A1 | 6/2007 | Lung |
| 2003/0186481 A1 | 10/2003 | Lung | | 2007/0147105 A1 | 6/2007 | Lung et al. |
| 2004/0026686 A1 | 2/2004 | Lung | | 2007/0153563 A1 | 7/2007 | Nirschl |
| 2004/0051094 A1 | 3/2004 | Ooishi | | 2007/0154847 A1 | 7/2007 | Chen et al. |
| 2004/0113137 A1 | 6/2004 | Lowrey | | 2007/0155172 A1 | 7/2007 | Lai et al. |
| 2004/0165422 A1 | 8/2004 | Hideki et al. | | 2007/0158632 A1 | 7/2007 | Ho |
| 2004/0248339 A1 | 12/2004 | Lung | | 2007/0158633 A1 | 7/2007 | Lai et al. |
| 2004/0256610 A1 | 12/2004 | Lung | | 2007/0158645 A1 | 7/2007 | Lung |
| 2005/0018526 A1 | 1/2005 | Lee | | 2007/0158690 A1 | 7/2007 | Ho et al. |
| 2005/0029502 A1 | 2/2005 | Hudgens | | 2007/0158862 A1 | 7/2007 | Lung |
| 2005/0029503 A1* | 2/2005 | Johnson ............... 257/4 | | 2007/0161186 A1 | 7/2007 | Ho |
| 2005/0062087 A1 | 3/2005 | Chen et al. | | 2007/0170881 A1 | 7/2007 | Noh et al. |
| 2005/0093022 A1 | 5/2005 | Lung | | 2007/0173019 A1 | 7/2007 | Ho et al. |
| 2005/0127349 A1 | 6/2005 | Horak et al. | | 2007/0173063 A1 | 7/2007 | Lung |
| 2005/0145984 A1 | 7/2005 | Chen et al. | | 2007/0176261 A1 | 8/2007 | Lung |
| 2005/0191804 A1 | 9/2005 | Lai et al. | | 2007/0201267 A1 | 8/2007 | Happ et al. |
| 2005/0201182 A1 | 9/2005 | Osada et al. | | 2007/0215852 A1 | 9/2007 | Lung |
| 2005/0212024 A1 | 9/2005 | Happ | | 2007/0224726 A1 | 9/2007 | Chen et al. |
| 2005/0212026 A1 | 9/2005 | Chung et al. | | 2007/0235811 A1 | 10/2007 | Furukawa et al. |
| 2005/0215009 A1 | 9/2005 | Cho | | 2007/0236989 A1 | 10/2007 | Lung |
| 2005/0263829 A1 | 12/2005 | Song et al. | | 2007/0246699 A1 | 10/2007 | Lung |
| 2006/0006472 A1 | 1/2006 | Jiang | | 2007/0249090 A1 | 10/2007 | Philipp et al. |
| 2006/0038221 A1 | 2/2006 | Lee et al. | | 2007/0257300 A1 | 11/2007 | Ho et al. |
| 2006/0066156 A1 | 3/2006 | Dong et al. | | 2007/0262388 A1 | 11/2007 | Ho et al. |
| 2006/0073642 A1 | 4/2006 | Yeh et al. | | 2007/0274121 A1 | 11/2007 | Lung et al. |
| 2006/0091476 A1 | 5/2006 | Pinnow et al. | | 2007/0285960 A1 | 12/2007 | Lung et al. |
| 2006/0094154 A1 | 5/2006 | Lung | | 2007/0298535 A1 | 12/2007 | Lung |
| 2006/0108667 A1 | 5/2006 | Lung | | 2008/0006811 A1 | 1/2008 | Philipp et al. |
| 2006/0110878 A1 | 5/2006 | Lung et al. | | 2008/0012000 A1 | 1/2008 | Harshfield |
| 2006/0110888 A1 | 5/2006 | Cho et al. | | 2008/0014676 A1 | 1/2008 | Lung et al. |

| | | | |
|---|---|---|---|
| 2008/0025089 | A1 | 1/2008 | Scheuerlein et al. |
| 2008/0043520 | A1 | 2/2008 | Chen |
| 2008/0094871 | A1 | 4/2008 | Parkinson |
| 2008/0101110 | A1 | 5/2008 | Happ et al. |
| 2008/0137400 | A1 | 6/2008 | Chen et al. |
| 2008/0164453 | A1 | 7/2008 | Breitwisch et al. |
| 2008/0165569 | A1 | 7/2008 | Chen et al. |
| 2008/0165570 | A1 | 7/2008 | Happ et al. |
| 2008/0165572 | A1 | 7/2008 | Lung |
| 2008/0166875 | A1 | 7/2008 | Lung |
| 2008/0179582 | A1 | 7/2008 | Burr et al. |
| 2008/0180990 | A1 | 7/2008 | Lung |
| 2008/0186755 | A1 | 8/2008 | Lung et al. |
| 2008/0191187 | A1 | 8/2008 | Lung et al. |
| 2008/0192534 | A1 | 8/2008 | Lung |
| 2008/0197334 | A1 | 8/2008 | Lung |
| 2008/0224119 | A1 | 9/2008 | Burr et al. |
| 2008/0225489 | A1 | 9/2008 | Cai et al. |

FOREIGN PATENT DOCUMENTS

| | | |
|---|---|---|
| WO | 0145108 | 6/2001 |
| WO | 0225733 | 3/2002 |

OTHER PUBLICATIONS

Chao, D-S. et al., "Low Programming Current Phase Change Memory Cell with Double gst Thermally Confined Structure," VLSI-TSA 2007, International symposium Apr. 23-25, 2007, 2pp.

Adler, David, "Amorphous-Semiconductor Devices," Sci. Amer., vol. 236, pp. 36-48, May 1977.

Adler, D. et al., "Threshold Switching in Chalcogenide-Glass Thin Films," J. Appl/ Phys 51(6), Jun. 1980, pp. 3289-3309.

Ahn, S.J. et al., "A Highly Manufacturable High Density Phase Change Memory of 64 Mb and Beyond," IEEE IEDM 2004, pp. 907-910.

Ahn, S. J. et al., "Highly Reliable 5nm Contact Cell Technology for 256Mb PRAM," VLSI Technology, Digest of Technical Papers, Jun. 14-16, 2005, pp. 98-99.

Axon Technologies Corporation paper: Technology Description, pp. 1-6.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chen, AN et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al., "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al., "An Edge Contact Type Cell fro Phase Change RAM Featuring Very Low Power Consumption," 2003 Symposium on VLSI Technology Digest of Technical Papers, pp. 175-176.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24?m-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martin H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

"Magnetic Bit Boost," www.sciencesnews.org <http://www.sciencenews.org>, Dec. 18 & 25, 2004, p. 389, vol. 166.

Mott, Nevill, "Electrons in Glass," Nobel Lecture, Dec. 8, 1977, Physics, 1977, pp. 403-413.

"New Memories Tap Spin, Gird for Battle," Sciences News, Apr. 3, 1999, p. 223, vol. 155.

"Optimized Thermal Capacitance in a Phase Change Memory Cell Design", IPCOM000141986D, IP.com Prior Art Database, Oct. 18, 2006, 4 pp.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel ?Trench Phase-Change Memory Cell for Embedded and Stand-Alone Non-Volatile Memory Applications," 2004 Symposium on VLSI Technology Digest of Technical Papers, pp. 18-19.

Pirovano, Agostino et al., "Reliability Study of Phase-Change Nonvolatile Memories," IEEE Transactions on Device and Materials Reliability, Sep. 2004, pp. 422-427, vol. 4, No. 3.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

"Remembering on the Cheap," www.sciencenews.org <http://www.sciencenews.org/>, Mar. 19, 2005, p. 189, vol. 167.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, 'http://klabs.org/richcontent/MAPLDCon99/Papers/P21_Tyson_P.PDF#search=nonvolatile %20high%20density%20high%20performance%20phase%20 change%20memory <http://klabs.org/richcontent/MAPLDCon99/

Papers/P21_Tyson_P.PDF#search='nonvolatile%20high%20density%20high%20performance%20phase%20change%20memory>', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era—vol. 4, pp. 674-679, 2004.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

"Thermal Conductivity of Crystalline Dielectrics" in CRC Handbook of Chemistry and Physics, Internet Version 2007, (87th edition), David R. Lide, ed. Taylor and Francis, Boca Raton, FL.

Schafft, Harry A. et al., "Thermal Conductivity Measurements of Thin Films Silicon Dioxide", Proceedings of the IEEE 1989 International Conference on Microelectronic Test Structures, vol. 2, No. 1, Mar. 1989, pp. 121-124.

Gleixner, "Phase Change Memory Reliability", 22nd NVSMW, Aug. 26, 2007, 46 pages.

Yamada, Noboru, "Potential of Ge-Sb-Te phase-change optical disks for high-data-rate recording in the near future," (Conference Proceedings Paper), Jul. 30, 1997, vol. 3109, 10 pages.

\* cited by examiner

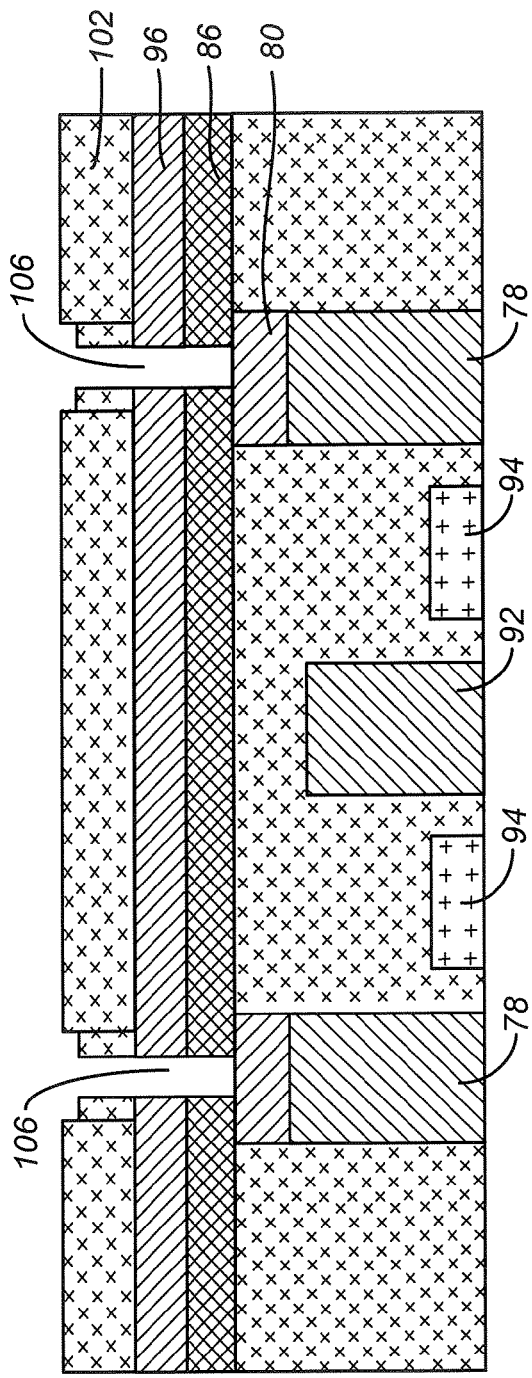
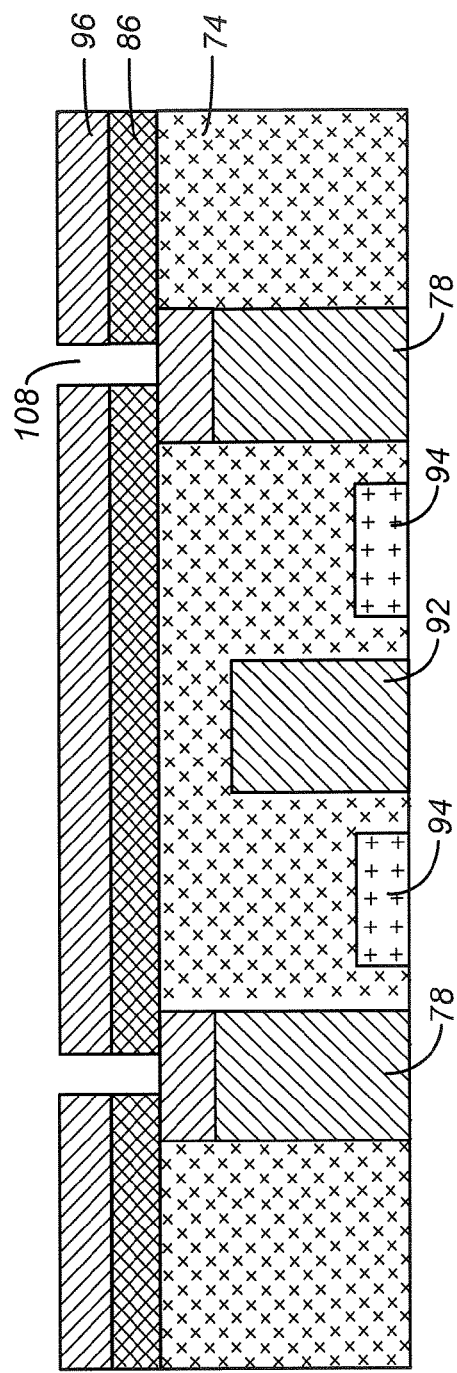
FIG. 9
FIG. 10

MEMORY CELL SIDEWALL CONTACTING SIDE ELECTRODE

BACKGROUND OF THE INVENTION

1. Field of the Invention

The present invention relates to high density memory devices based on memory materials, for example resistor random access memory (RRAM) devices, and to methods for manufacturing such devices. The memory material is switchable between electrical property states by the application of energy. The memory materials may be phase change based memory materials, including chalcogenide based materials, and other materials.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state; this difference in resistance can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and by reducing the size of the contact area between electrodes and the phase change material, so that higher current densities are achieved with small absolute current values through the phase change material element.

One direction of development has been toward using small quantities of programmable resistive material, particularly in small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

In phase change memory, data is stored by causing transitions in the phase change material between amorphous and crystalline states using current. Current heats the material and causes transitions between the states. The change from the amorphous to the crystalline state is generally a lower current operation. The change from crystalline to amorphous, referred to as reset herein, is generally a higher current operation. It is desirable to minimize the magnitude of the reset current used to cause transition of phase change material from crystalline state to amorphous state. The magnitude of the reset current needed for reset can be reduced by reducing the size of the active phase change material element in the cell. One problem associated with phase change memory devices arises because the magnitude of the current required for reset operations depends on the volume of phase change material that must change phase. Thus, cells made using standard integrated circuit manufacturing processes have been limited by the minimum feature size of manufacturing equipment. Thus, techniques to provide sublithographic dimensions for the memory cells must be developed, which can lack uniformity or reliability needed for large scale, high density memory devices.

One approach to controlling the size of the active area in a phase change cell is to devise very small electrodes for delivering current to a body of phase change material. This small electrode structure induces phase change in the phase change material in a small area like the head of a mushroom, at the location of the contact. See, U.S. Pat. No. 6,429,064, issued Aug. 6, 2002, to Wicker, "Reduced Contact Areas of Sidewall Conductor;" U.S. Pat. No. 6,462,353, issued Oct. 8, 2002, to Gilgen, "Method for Fabricating a Small Area of Contact Between Electrodes;" U.S. Pat. No. 6,501,111, issued Dec. 31, 2002, to Lowrey, "Three-Dimensional (3D) Programmable Device;" U.S. Pat. No. 6,563,156, issued Jul. 1, 2003, to Harshfield, "Memory Elements and Methods for Making Same."

Accordingly, an opportunity arises to devise methods and structures that form memory cells with structures that have small active regions of programmable resistive material using reliable and repeatable manufacturing techniques.

BRIEF SUMMARY OF THE INVENTION

Conventional memory cells of the type including a memory material switchable between electrical property states by the application of energy, in particular phase change random access memory devices, typically have the side electrode deposited onto the surface of the phase change material. The resulting strength of the top interface is often poor because the coefficient of thermal expansion of the typical phase change material, such as GST, is larger than the coefficient of thermal expansion of the typical side electrode material, such as TiN. This contrasts with the interface between the phase change material and a bottom electrode because the phase change material is deposited onto the bottom electrode. The present invention helps to eliminate this weak top interface problem because the memory material is deposited onto both the bottom electrode and the side electrode.

A first example of a memory cell, of the type including a memory material switchable between electrical property states by the application of energy, includes a memory cell access layer and a memory cell layer over the memory cell access layer. The memory cell access layer comprises a bottom electrode. The memory cell layer comprises a dielectric layer over the memory cell access layer with a side electrode over the dielectric layer. The side electrode and the dielectric layer at least partially define a void. A memory element is within the void. The memory element comprises a memory material switchable between electrical property states by the application of energy. The memory element is in electrical contact with the side electrode and with the bottom electrode. In some examples the memory element has a pillar shape with a generally constant lateral dimension with the side electrode and the dielectric layer surrounding and in contact with first and second portions of the memory element.

An example of a method for manufacturing a memory cell, of the type including a memory material switchable between electrical property states by the application of energy, is carried out as follows. A memory cell access layer, comprising a bottom electrode, is provided. A first dielectric layer is deposited onto the memory cell access layer. A layer of a side electrode material is deposited onto the first dielectric layer. A hole is formed through the side electrode material and the first dielectric layer to expose the bottom electrode and to create a side electrode. A memory element is created in the hole in electrical contact with the side electrode and the bottom electrode. The memory element comprises a memory material switchable between electrical property states by the application of energy. In some examples the hole forming step comprises the following steps. A supplemental layer is deposited onto the layer of the side electrode material. An opening is formed in the supplemental layer aligned with the bottom electrode. A material is deposited into the opening to create a reduced diameter opening therein. A small diameter pore, aligned with the reduced diameter opening, is created with the small diameter pore extending to the side electrode. The supplemental layer is removed.

Other features, aspects and advantages of the present invention can be seen on review the figures, the detailed description, and the claims which follow.

BRIEF DESCRIPTION OF THE DRAWINGS

FIGS. 5-15 illustrate stages in an example of the manufacture of the memory cell device of FIG. 3.

DETAILED DESCRIPTION OF THE INVENTION

Figure 1:
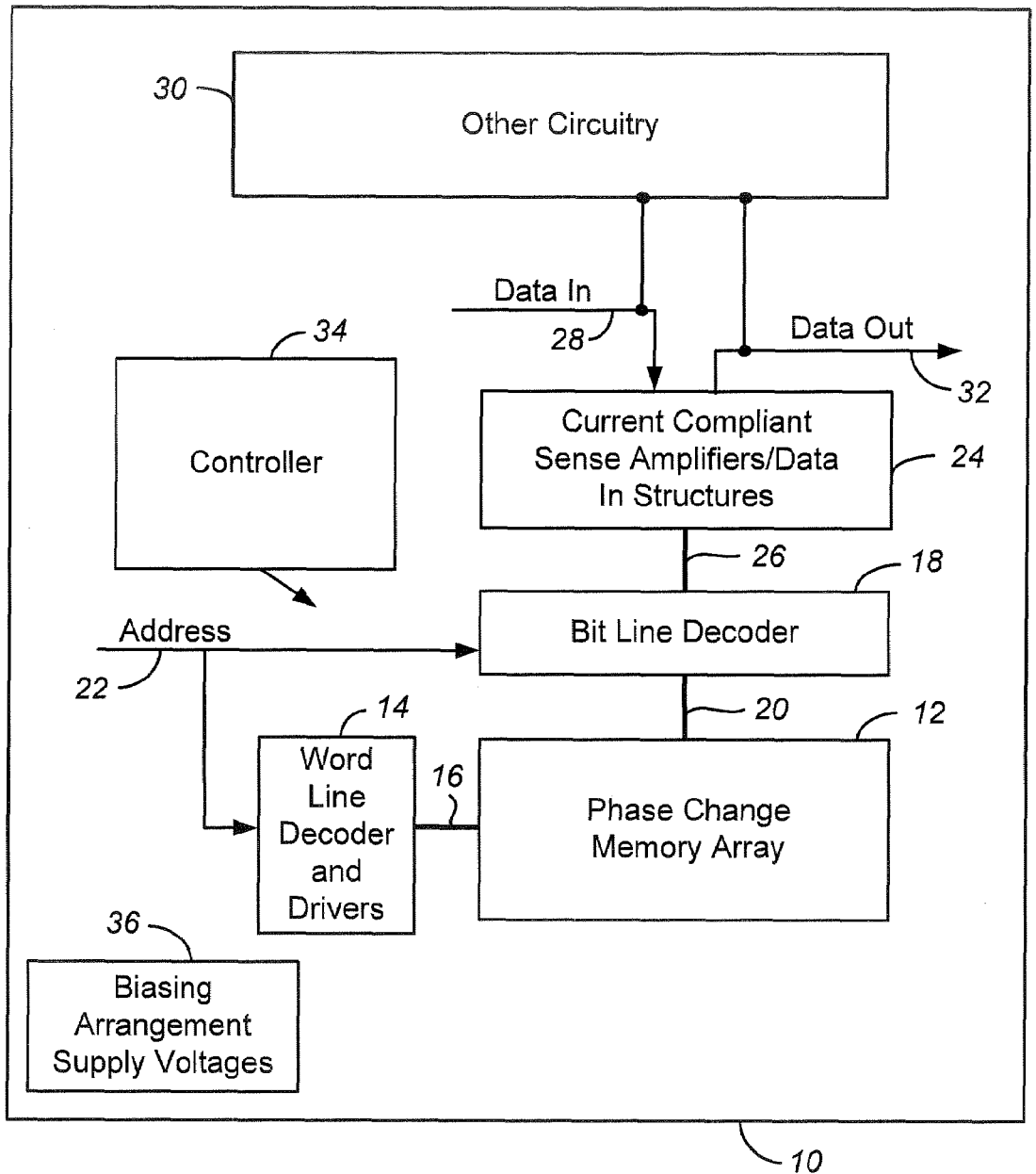
FIG. 1 is a block diagram of an integrated circuit device in accordance with the present invention.

The following description of the invention will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

Referring to FIG. 1, shown is a simplified block diagram of an integrated circuit 10 in which the present invention may be implemented. Circuit 10 includes a memory array 12 implemented using phase change memory cells (not shown) on a semiconductor substrate, discussed more fully below. A word line decoder 14 is in electrical communication with a plurality of word lines 16. A bit line decoder 18 is in electrical communication with a plurality of bit lines 20 to read data from, and write data to, the phase change memory cells (not shown) in array 12. Addresses are supplied on bus 22 to word line decoder and drivers 14 and bit line decoder 18. Sense amplifiers and data-in structures in block 24 are coupled to bit line decoder 18 via data bus 26. Data is supplied via a data-in line 28 from input/output ports on integrated circuit 10, or from other data sources internal or external to integrated circuit 10, to data-in structures in block 24. Other circuitry 30 may be included on integrated circuit 10, such as a general purpose processor or special purpose application circuitry, or a combination of modules providing system-on-a-chip functionality supported by array 12. Data is supplied via a data-out line 32 from the sense amplifiers in block 24 to input/output ports on integrated circuit 10, or to other data destinations internal or external to integrated circuit 10.

A controller 34 implemented in this example, using a bias arrangement state machine, controls the application of bias arrangement supply voltages 36, such as read, program, erase, erase verify and program verify voltages. Controller 34 may be implemented using special-purpose logic circuitry as known in the art. In alternative embodiments, controller 34 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 34.

Figure 2:
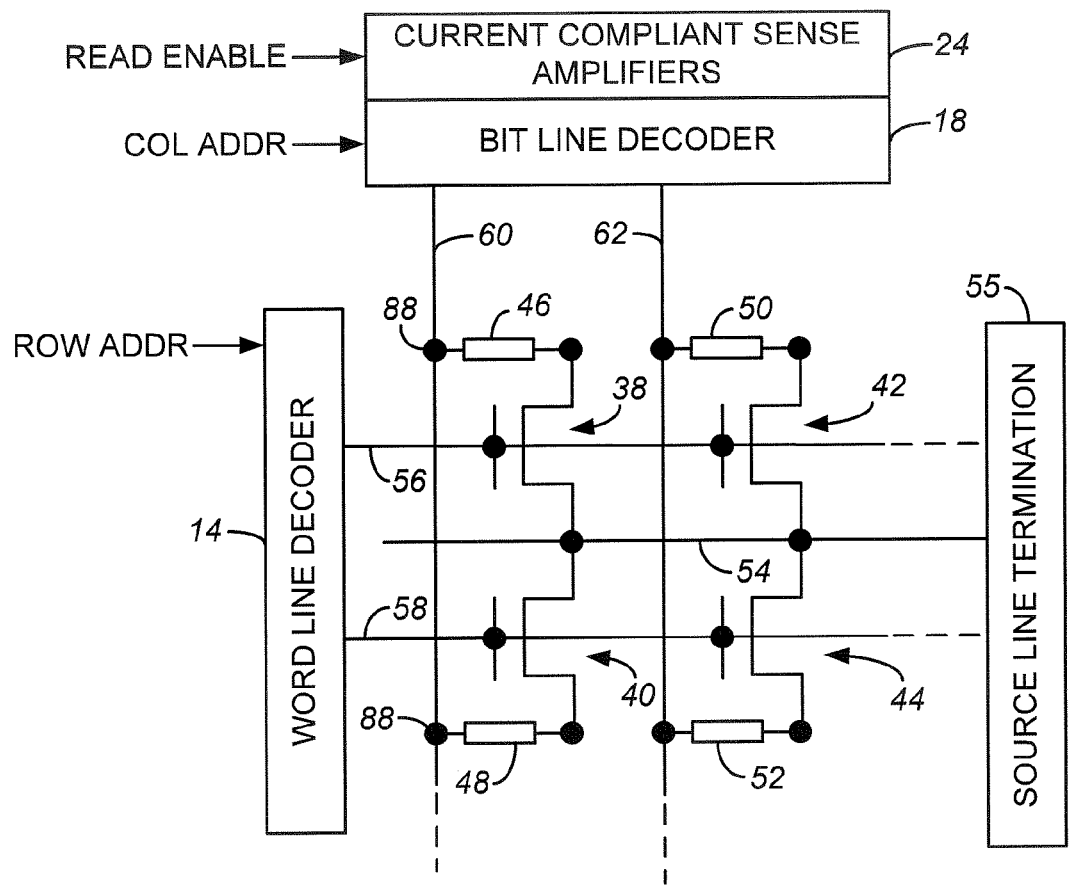
FIG. 2 is a partial schematic diagram of a representative memory array as shown in FIG. 1.

As shown in FIG. 2 each of the memory cells of array 12 includes an access transistor (or other access device such as a diode), four of which are shown as 38, 40, 42 and 44, and a phase change element, shown as 46, 48, 50 and 52. Sources of each of access transistors 38, 40, 42 and 44 are connected in common to a source line 54 that terminates in a source line termination 55. In another embodiment the source lines of the select devices are not electrically connected, but independently controllable. A plurality of word lines 16 including word lines 56 and 58 extend parallel along a first direction. Word lines 56 and 58 are in electrical communication with word line decoder 14. The gates of access transistors 38 and 42 are connected to a common word line, such as word line 56, and the gates of access transistors 40 and 44 are connected in common to word line 58. A plurality of bit lines 20 including bit lines 60 and 62 have one end of phase change elements 46 and 48 connected to bit line 60. Specifically, phase change element 46 is connected between the drain of access transistor 38 and bit line 60, and phase change element 48 is connected between the drain of access transistor 48 and bit line 60. Similarly, phase change element 50 is connected between the drain of access transistor 42 and bit line 62, and phase change element 52 is connected between the drain of access transistor 44 and bit line 62. It should be noted that four memory cells are shown for convenience of discussion and in practice array 12 may comprise thousands to millions of such memory cells. Also, other array structures may be used, e.g. the phase change memory element is connected to source.

Figure 3:
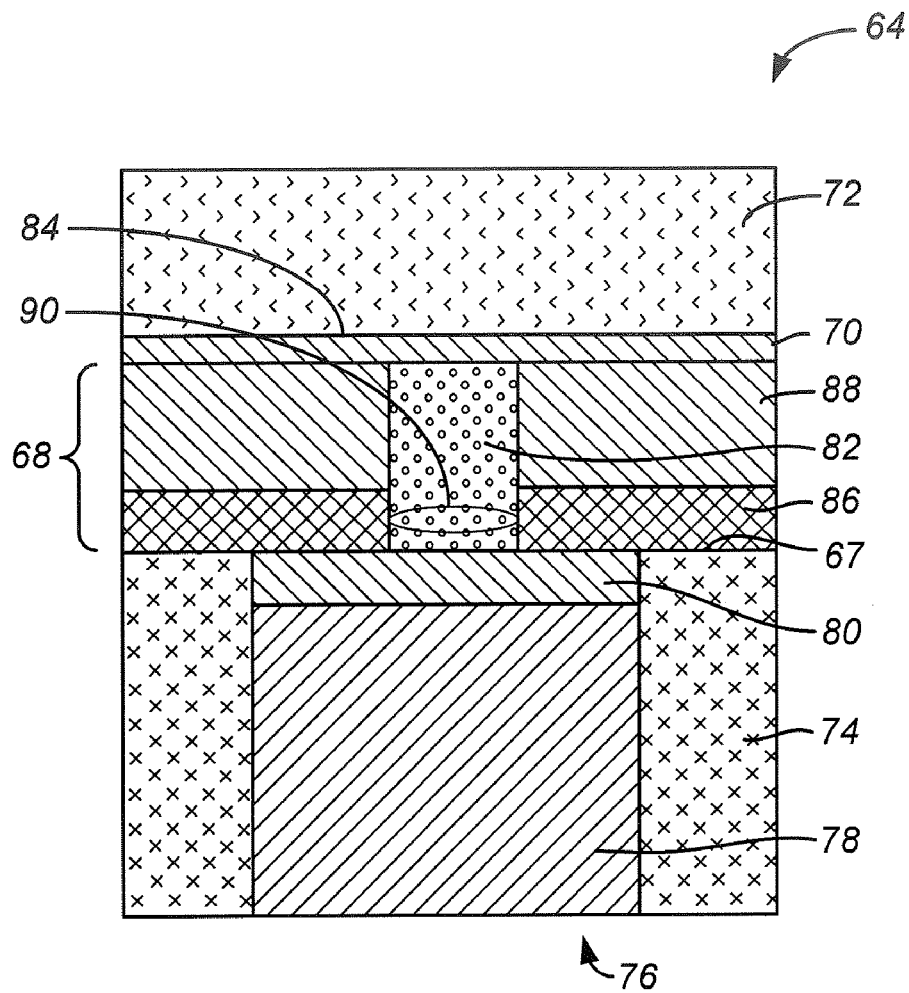
FIG. 3 is a simplified cross-sectional view of one example of a memory cell device made according to the present invention.

FIG. 3 illustrates an example of a memory cell device 64 made according to the invention. Device 64 includes a memory cell access layer 66 (see FIG. 5) with a memory cell layer 68 on top of the memory cell access layer 66. An electrically conductive barrier layer 70 is located between a bit line 72 and memory cell layer 68.

Memory cell access layer 66 has an upper surface 67 and includes a dielectric fill layer 74, typically made of silicon dioxide. Layer 66 also includes a stack 76 including a plug 78, typically of tungsten, and a bottom electrode 80 extending to upper surface 67. Bottom electrode 80 is preferably made of an electrically conductive material such as TiN, WN, TiAlN or TaN, to provide enhanced contact with a memory element 82 of memory cell layer 68. Memory element 82 includes a memory material switchable between electrical property states by the application of energy. The memory material is typically a phase change material such as GST, discussed in more detail below.

Memory cell layer 68 has an upper surface 84 and includes a dielectric layer 86 and a side electrode 88 which define a void (see FIG. 10) containing memory element 82. Memory element 82 and side electrode 88 both extend to upper surface 84. Layer 86 is typically $SiO_2$, SiN, $TaO_x$ or $AlO_x$, or a low thermal conductivity electrical insulator. With this arrangement bottom electrode 80 acts as a heater and dielectric layer 86 acts as a thermal insulator so that the transition region 90 within memory element 82 is located within the portion of memory element 82 surrounded by dielectric layer 86.

Figure 4:
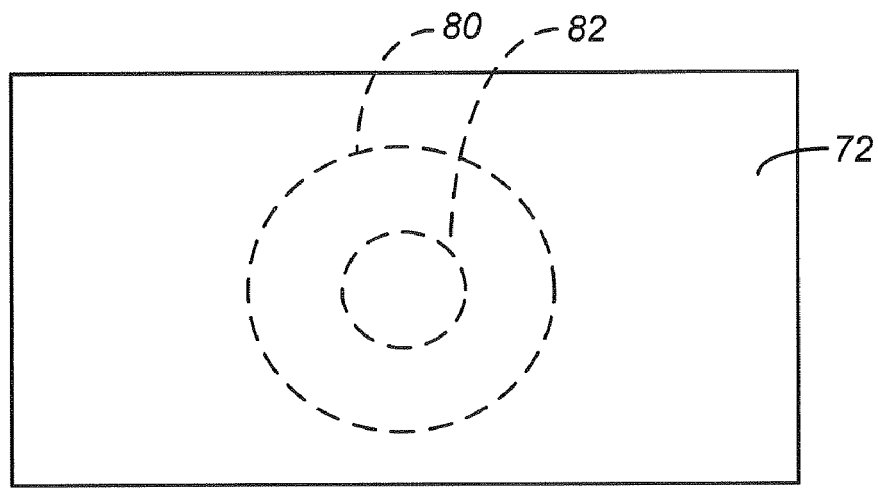
FIG. 4 is a top view of the device of FIG. 3 with the memory element and bottom electrode shown in dashed lines.

FIG. 4 is top view of the memory cell device 64 of FIG. 3 showing memory element 82 and bottom electrode 80 in broken lines.

Figure 5:
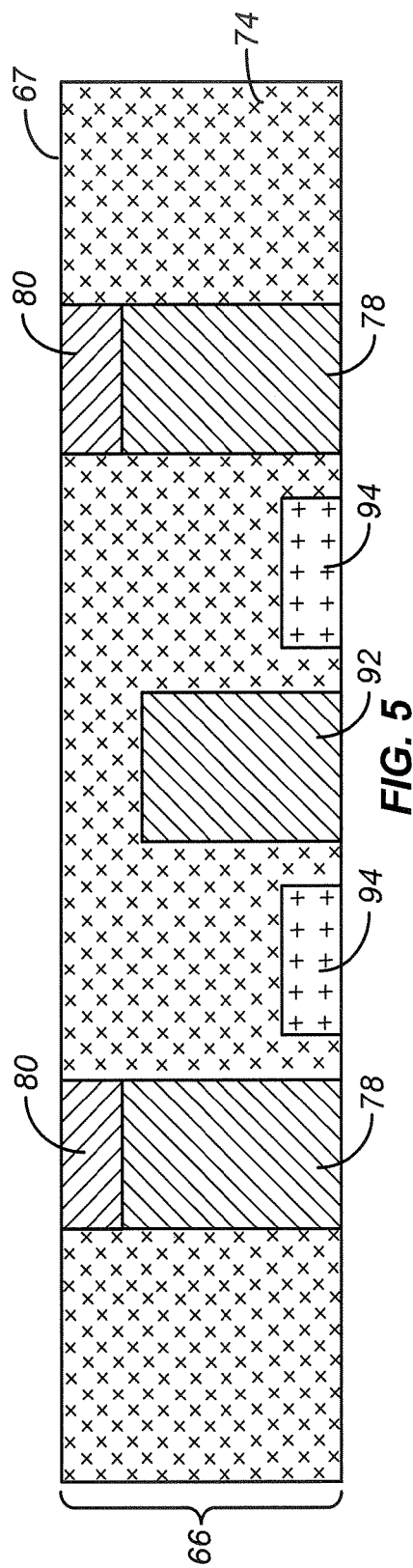

FIGS. 5-15 illustrate typical steps in the manufacture of one example of memory cell device 64. In FIG. 5 memory cell access layer 66 is shown to include stacks 76 with a common source line 92 and first and second polysilicon word lines 94 therebetween. In this example transistors act as the access devices. Other access devices, such as diodes, may also be used.

Figure 6:
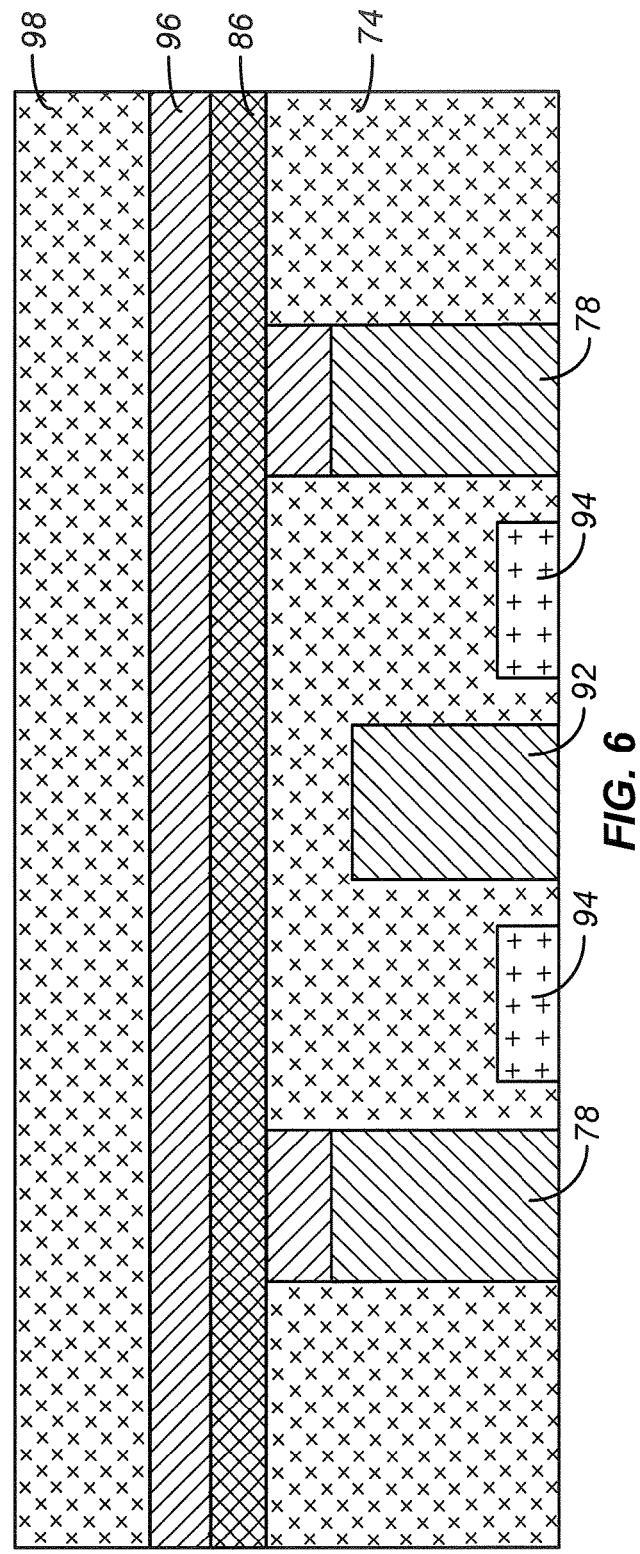

FIG. 6 shows results of deposition of dielectric layer 86 on top of which a side electrode material layer 96, from which side electrode 88 is made, it is deposited. A supplemental dielectric layer 98, typically amorphous silicon, is formed on top of layer 96.

Figure 7:
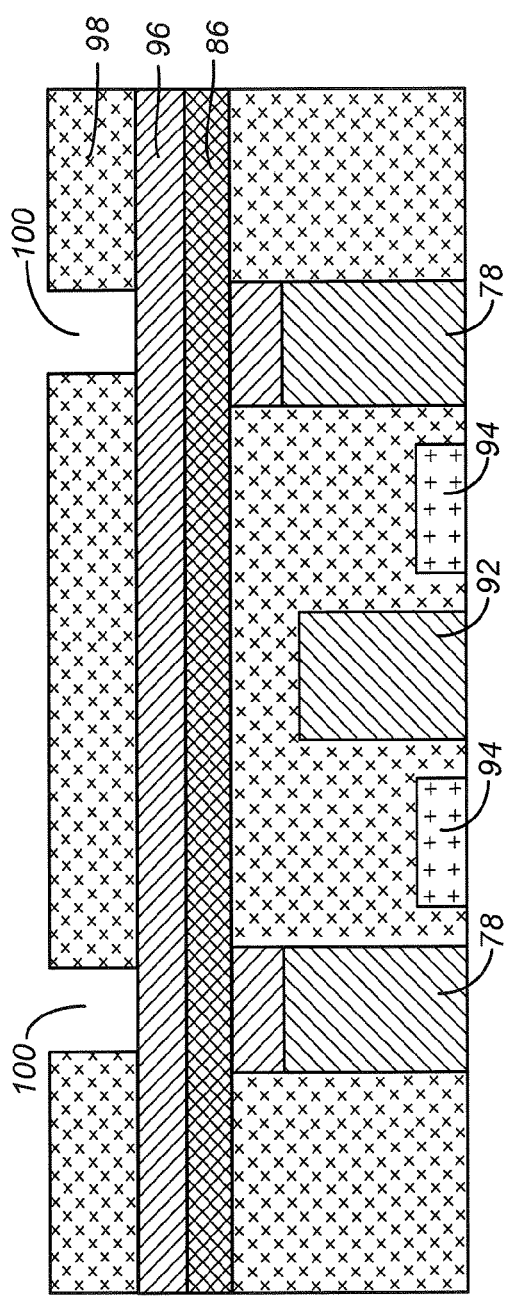
Figure 8:
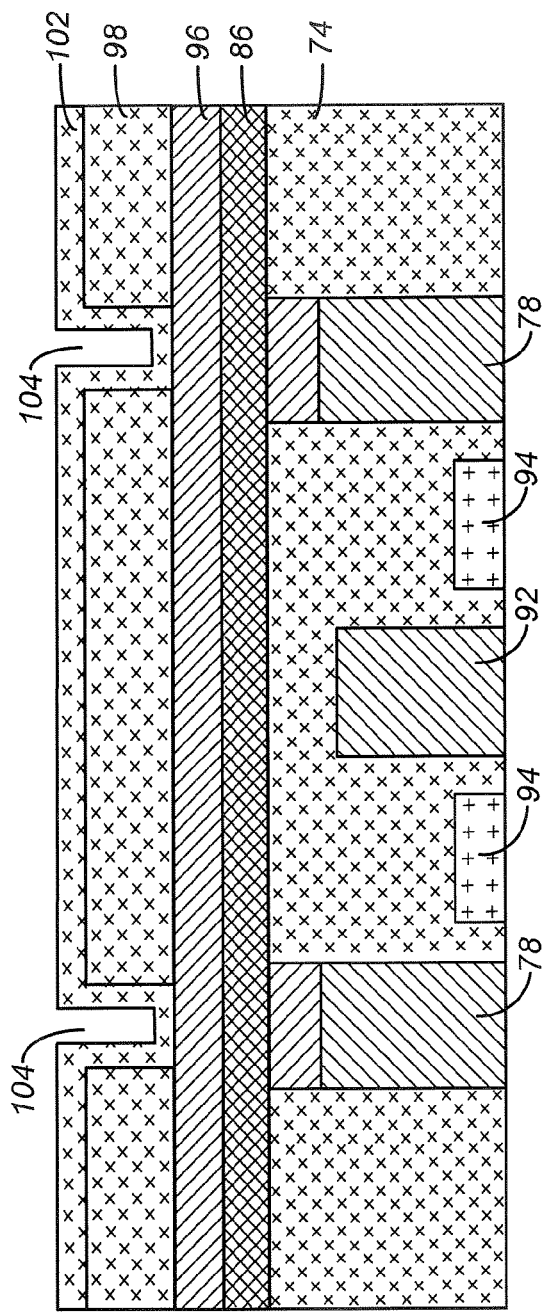
Figure 11:
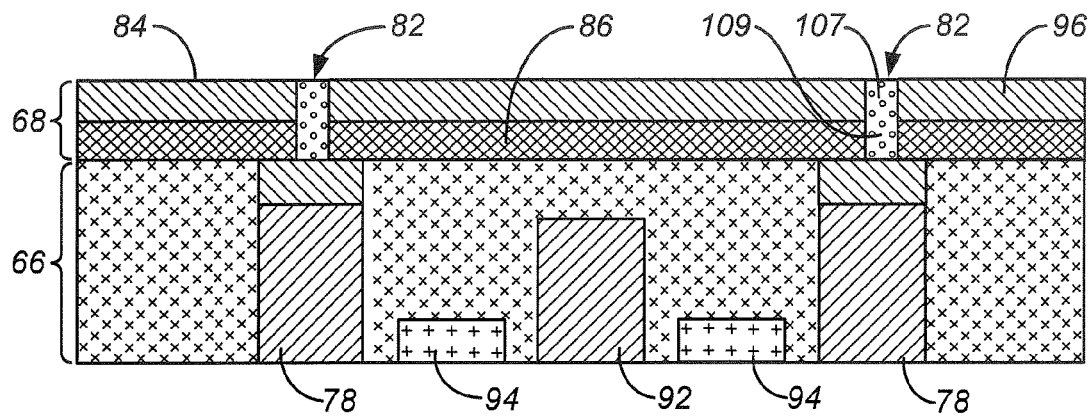

FIG. 7 illustrates the result of forming openings 100 in layer 98, the openings generally centered over bottom electrodes 80. In FIG. 8 a material layer 102, typically amorphous silicon, is deposited on the structure of FIG. 7 so to be deposited on the portions of layers 96, 98 defining openings 100 to create reduced diameter openings 104. The process used to deposit layer 102 is typically an ALD process. The result of a small pore etching step is shown in FIG. 9. This step removes most of material layer 102 and forms a small diameter pore 106 through the bottom of reduced diameter opening 104 to pass through layers 96 and 86, stopping at bottom electrode 80. The remaining amorphous silicon layers 98, 102 are removed as shown in FIG. 10, typically by a KOH wet etch, leaving a void 108 defined by electrode material layer 96 and dielectric layer 86.

A memory material, typically a phase change material such as GST, is deposited into void 108. This is followed by a planarization step, typically chemical mechanical polishing, to form memory elements 82 and upper surface 84 of memory cell layer 68. See FIG. 11. Each memory element 82 includes a first portion 107 having a first outer peripheral surface; the side electrode 88 circumscribes and contacts the first outer peripheral surface of the memory element. In addition, each memory element 82 includes a second portion 109 having a second outer peripheral surface; dielectric layer 86 circumscribes and contacts the second outer peripheral surface of the memory element.

Figure 13:
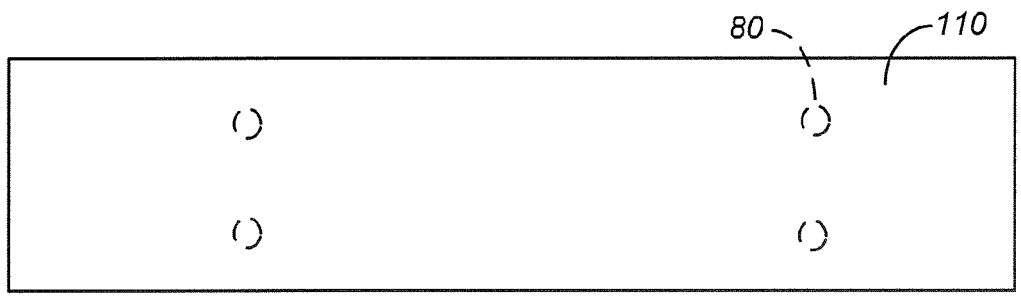
Figure 12:
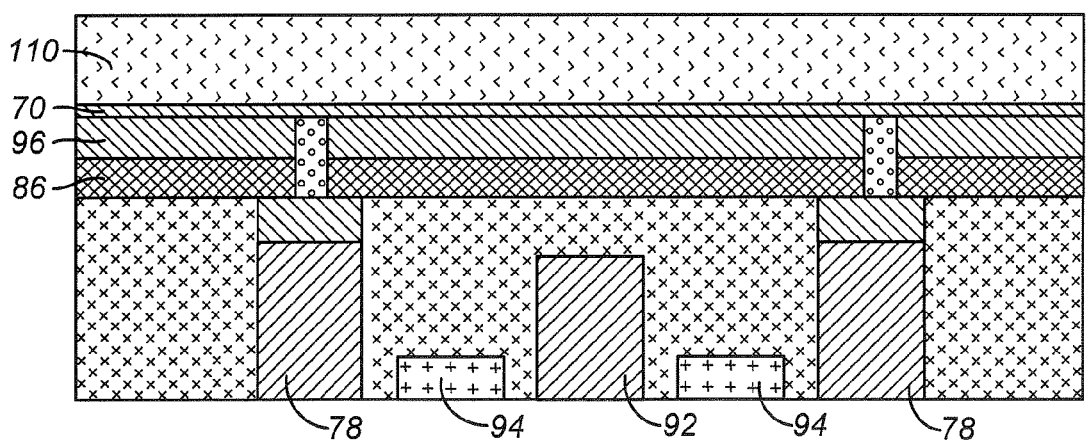
Figure 15:
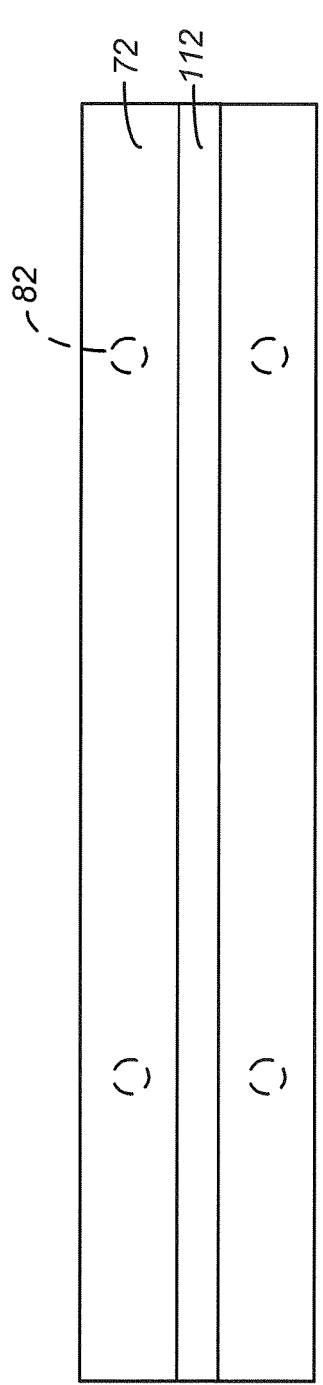
Figure 14:
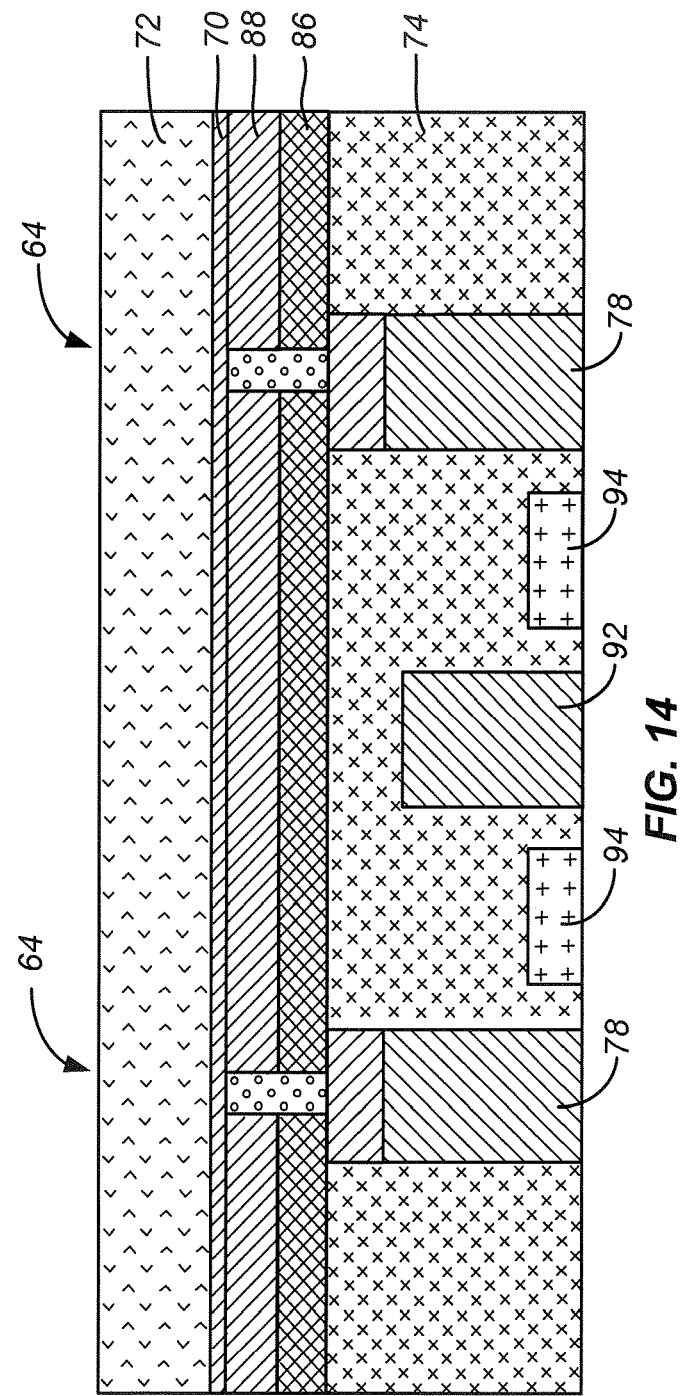

In some embodiments electrically conductive barrier layer 70, typically TiN, is deposited on upper surface 84 and an electrically conductive bit line layer 110 is deposited on layer 70. Layer 70 is used to improve the contact between memory element 82 and bit line layer 110. FIG. 13 is a top view of the structure of FIG. 12 but with memory elements 82 illustrated in broken lines to show their orientation and spacing. FIGS. 14 and 15 show the result of forming a groove 112 through bit line layer 110, barrier layer 70, and side electrode material layer 96, stopping at the top of layer 86 to create memory cell devices 64, each with a bit line 72 and a side electrode 88.

Figure 16:
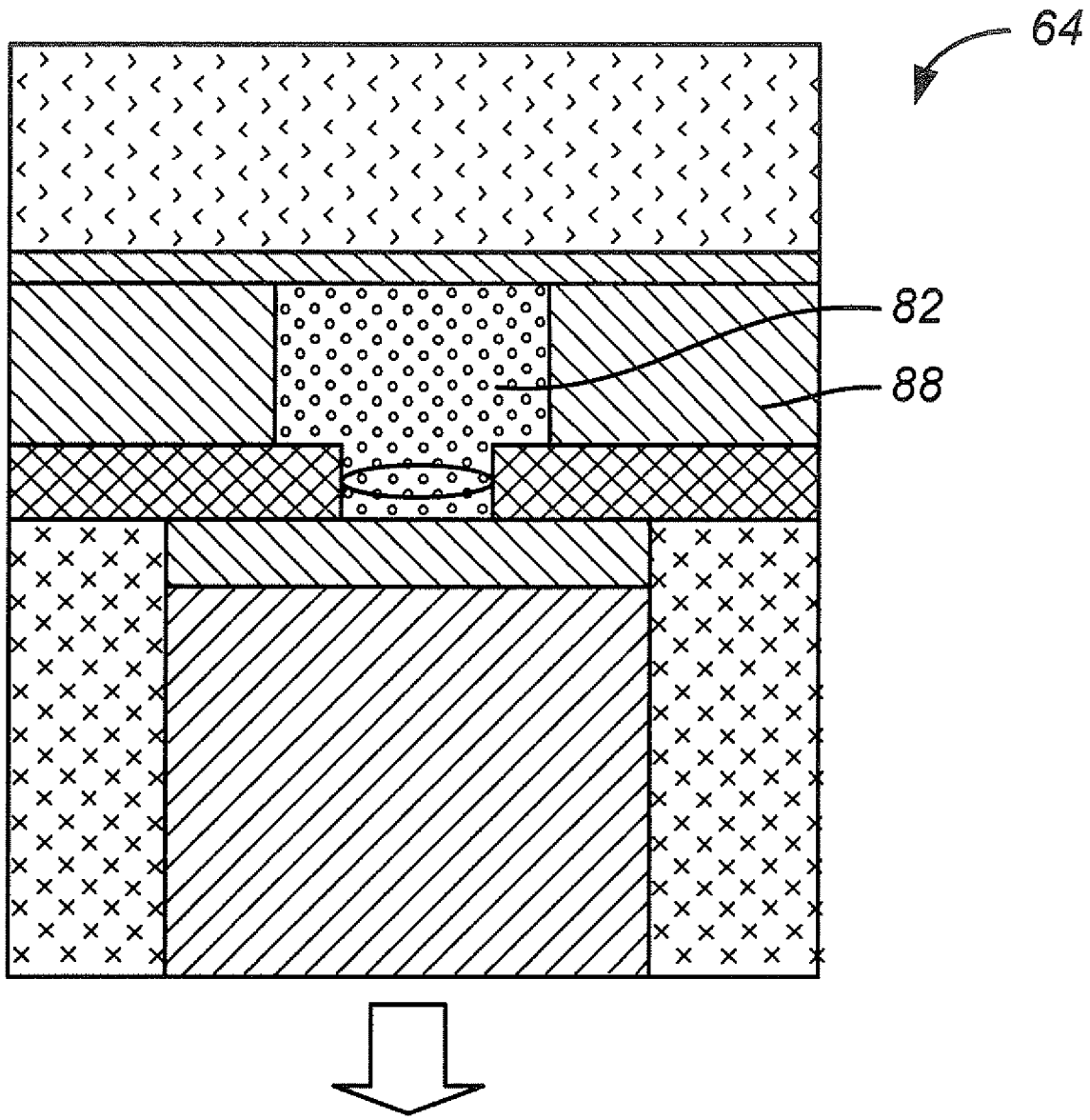
FIG. 16 shows alternative example of the memory cell device of FIG. 3.

FIG. 16 discloses an alternative memory cell device 64 in which the upper portion of memory element 82, defined by side electrode 88, has a larger lateral dimension or diameter than the lower portion of memory element 82, defined by dielectric layer 86. In other examples side electrode 88 is connected to a bit line in other ways, such as through vias formed in an overlying dielectric layer.

Dielectric layers 74, 86 may comprise an electrical insulator including one or more elements selected from the group consisting of Si, Ti, Al, Ta, N, O, and C. In preferred devices, dielectric layer 86 has a low thermal conductivity, less than about 0.014 J/cm*K*sec. In other preferred embodiments, when memory element 82 is made from a phase change material, dielectric layer 86 has a thermal conductivity less than that of the amorphous state of the phase change material, or less than about 0.003 J/cm*K*sec for a phase change material comprising GST. Representative thermally insulating materials include materials that are a combination of the elements silicon Si, carbon C, oxygen O, fluorine F, and hydrogen H. Examples of thermally insulating materials which are candidates for use for the thermally insulating dielectric materials include $SiO_2$, SiCOH, polyimide, polyamide, and fluorocarbon polymers. Other examples of materials which are candidates for use for the thermally insulating dielectric materials include fluorinated $SiO_2$, silsesquioxane, polyarylene ethers, parylene, fluoro-polymers, fluorinated amorphous carbon, diamond like carbon, porous silica, mesoporous silica, porous silsesquioxane, porous polyimide, and porous polyarylene ethers. In other embodiments, the thermally insulating structure comprises a gas-filled void for thermal insulation. A single layer or combination of layers within dielectric layer 86 can provide thermal and electrical insulation.

Useful characteristics of a programmable resistive type of memory material, like a phase change material, include the material having a resistance which is programmable, and preferably in a reversible manner, such as by having at least two solid phases that can be reversibly induced by electrical current. These at least two phases include an amorphous phase and a crystalline phase. However, in operation, the programmable resistive material may not be fully converted to either an amorphous or crystalline phase. Intermediate phases or mixtures of phases may have a detectable difference in material characteristics. The two solid phases should generally be bistable and have different electrical properties. The programmable resistive material may be a chalcogenide material. A chalcogenide material may include GST. In following sections of the disclosure, the phase change or other memory material is often referred to as GST, and it will be understood that other types of phase change materials can be used. A material useful for implementation of a memory cell as described herein is $Ge_2Sb_2Te_5$.

A memory cell device 64 as described herein is readily manufacturable using standard lithography and thin film deposition technologies, without requiring extraordinary steps to form sub-lithographic patterns, while achieving very small dimensions for the region of the cell that actually changes resistivity during programming. In embodiments of the invention, the memory material may be a programmable resistive material, typically a phase change material, such as $Ge_2Sb_2Te_5$ or other materials described below. The region in the memory element 82 that changes phase is small; and accordingly, the magnitude of the reset current required for changing the phase is very small.

Embodiments of memory cell device 64 include phase change based memory materials, including chalcogenide based materials and other materials, for memory element 82. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$, where a and b represent atomic percentages that total 100% of the atoms of the constituent elements. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. (Ovshinsky '112 patent, cols 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change materials are capable of being switched between a first structural state in which the material is in a generally amorphous solid phase, and a second structural state in which the material is in a generally crystalline solid phase in its local order in the active channel region of the cell. These phase change materials are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change materials can be changed from one phase state to another by application of electrical pulses. It has been observed that a shorter, higher amplitude pulse tends to change the phase change material to a generally amorphous state, and is referred to as a reset pulse. A longer, lower amplitude pulse tends to change the phase change material to a generally crystalline state, and is referred to as a program pulse. The energy in a shorter, higher amplitude pulse is high enough to allow for bonds of the crystalline structure to be broken and short enough to prevent the atoms from realigning into a crystalline state. Appropriate profiles for pulses can be determined empirically, without undue experimentation, specifically adapted to a particular phase change material and device structure.

The following are short summaries describing four types of resistive memory materials.

1. Chalcogenide Material $Ge_xSb_yTe_z$ 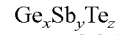

x:y:z=2:2:5

Or other compositions with x:0~5; y:0~5; z:0~10

GeSbTe with doping, such as N—, Si—, Ti—, or other element doping may also be used.

Formation method: By PVD sputtering or magnetron-sputtering method with reactive gases of Ar, $N_2$, and/or He, etc chalcogenide @ the pressure of 1 mtorr~100 mtorr. The deposition is usually done at room temperature. The collimator with aspect ratio of 1~5 can be used to improve the fill-in performance. To improve the fill-in performance, the DC bias of several ten to several hundred volts is also used. On the other hand, the combination of DC bias and the collimator can be used simultaneously.

The post deposition annealing treatment with vacuum or N2 ambient is sometimes needed to improve the crystallize state of chalcogenide material. The annealing temperature typically ranges 100 C to 400 C with an anneal time of less than 30 minutes.

The thickness of chalcogenide material depends on the design of cell structure. In general, a chalcogenide material with thickness of higher than 8 nm can have a phase change characterization so that the material exhibits at least two stable resistance states.

2. CMR (Colossal Magneto Resistance) Material $Pr_xCa_yMnO_3$ 

x:y=0.5:0.5

Or other compositions with x:0~1; y:0~1

Another CMR material that includes Mn oxide may be used

Formation method: By PVD sputtering or magnetron-sputtering method with reactive gases of Ar, $N_2$, $O_2$, and/or He, etc. at the pressure of 1 mtorr~100 mtorr. The deposition temperature can range from room temperature to ~600 C, depending on the post deposition treatment condition. A collimator with an aspect ratio of 1~5 can be used to improve the fill-in performance. To improve the fill-in performance, the DC bias of several ten to several hundred volts is also used. On the other hand, the combination of DC bias and the collimator can be used simultaneously. A magnetic field of several ten gauss to 10,000 gauss may be applied to improve the magnetic crystallized phase.

The post deposition annealing treatment with vacuum or $N_2$ ambient or $O_2/N_2$ mixed ambient may be needed to improve the crystallized state of CMR material. The annealing temperature typically ranges 400 C to 600 C with an anneal time of less than 2 hours.

The thickness of CMR material depends on the design of cell structure. The CMR thickness of 10 nm to 200 nm can be used to be the core material.

A buffer layer of YBCO (YBaCuO3, a kind of high temperature superconductor material) is often used to improve the crystallized state of CMR material. The YBCO is deposited before the deposition of CMR material. The thickness of YBCO ranges 30 nm to 200 nm.

3. 2-Element Compound $Ni_xO_y$; $Ti_xO_y$; $Al_xO_y$; $W_xO_y$; $Zn_xO_y$; $Zr_xO_y$; $Cu_xO_y$; etc x:y=0.5:0.5

Other compositions with x:0~1; y:0~1

Formation method:

1. Deposition: By PVD sputtering or magnetron-sputtering method with reactive gases of Ar, $N_2$, $O_2$, and/or He, etc. at the pressure of 1 mtorr~100 mtorr, using a target of metal oxide, such as $Ni_xO_y$; $Ti_xO_y$; $Al_xO_y$; $W_xO_y$; $Zn_xO_y$; $Zr_xO_y$; $Cu_xO_y$; etc. The deposition is usually done at room temperature. A collimator with an aspect ratio of 1~5 can be used to improve the fill-in performance. To improve the fill-in performance, the DC bias of several ten to several hundred volts is also used. If desired, they combination of DC bias and the collimator can be used simultaneously.

The post deposition annealing treatment with vacuum or $N_2$ ambient or $O_2/N_2$ mixed ambient as sometimes needed to improve the oxygen distribution of metal oxide. The annealing temperature ranges 400 C to 600 C with an anneal time of less than 2 hours.

2. Reactive deposition: By PVD sputtering or magnetron-sputtering method with reactive gases of $Ar/O_2$, $Ar/N_2/O_2$, pure $O_2$, $He/O_2$, $He/N_2/O_2$ etc. at the pressure of 1 mtorr~100 mtorr, using a target of metal oxide, such as Ni, Ti, Al, W, Zn, Zr, or Cu etc. The deposition is usually done at room temperature. A collimator with an aspect ratio of 1~5 can be used to improve the fill-in performance. To improve the fill-in performance, a DC bias of several ten to several hundred volts is also used. If desired, the combination of DC bias and the collimator can be used simultaneously.

The post deposition annealing treatment with vacuum or $N_2$ ambient or $O_2/N_2$ mixed ambient is sometimes needed to improve the oxygen distribution of metal oxide. The annealing temperature ranges 400 C to 600 C with an anneal time of less than 2 hours.

3. Oxidation: By a high temperature oxidation system, such as furnace or RTP system. The temperature ranges from 200 C to 700 C with pure $O_2$ or $N_2/O_2$ mixed gas at a pressure of several mtorr to 1 atm. The time can range several minute to hours. Another oxidation method is plasma oxidation. An RF or a DC source plasma with pure $O_2$ or $Ar/O_2$ mixed gas or $ArN_2/O_2$ mixed gas at a pressure of 1 mtorr to 100 mtorr is used to oxidize the surface of metal, such as Ni, Ti, Al, W, Zn, Zr, or Cu etc. The oxidation time ranges several seconds to several minutes. The oxidation temperature ranges room temperature to 300 C, depending on the degree of plasma oxidation.

4. Polymer material

TCNQ with doping of Cu, $C_{60}$, Ag etc.

PCBM-TCNQ mixed polymer

Formation method:

1. Evaporation: By thermal evaporation, e-beam evaporation, or molecular beam epitaxy (MBE) system. A solid-state TCNQ and dopant pellets are co-evaporated in a single chamber. The solid-state TCNQ and dopant pellets are put in a W-boat or a Ta-boat or a ceramic boat. A high electrical current or an electron-beam is applied to melt the source so that the materials are mixed and deposited on wafers. There are no reactive chemistries or gases. The deposition is done at a pressure of 10-4 torr to 10-10 torr. The wafer temperature ranges from room temperature to 200 C.

The post deposition annealing treatment with vacuum or $N_2$ ambient is sometimes needed to improve the composition distribution of polymer material. The annealing temperature ranges room temperature to 300 C with an anneal time of less than 1 hour.

2. Spin-coat: By a spin-coater with the doped-TCNQ solution @ the rotation of less than 1000 rpm. After spin-coating, the wafer is put to wait the solid-state formation @ room temperature or temperature of less than 200 C. The waiting time ranges from several minutes to days, depending on the temperature and on the formation conditions.

For additional information on the manufacture, component materials, use and operation of phase change random access memory devices, see U.S. patent application Ser. No. 11/155,067, filed 17 Jun. 2005, entitled Thin Film Fuse Phase Change Ram And Manufacturing Method.

It is preferred that all or part of the portions of bottom and side electrodes 80, 88 contacting memory element 82 comprise an electrode material, such as TiN, or another conductor selected for compatibility with the phase change material of memory element 82. In the embodiment of FIG. 3, side electrode 88 and bottom electrode 80 are made of TiN while plug 78 comprises tungsten. Other types of conductors can be used for the plug structures and the top and bottom electrodes structures, including for example aluminum and aluminum alloys, TiN, TaN, TiAlN or TaAlN. Other conductors that might be used comprise one or more elements selected from the group consisting of Ti, W, Mo, Al, Ta, Cu, Pt, Ir, La, Ni, Ru and O. TiN may be preferred because it makes good contact with GST (discussed above) as memory material element 82, it is a common material used in semiconductor manufacturing, and it provides a good diffusion barrier at the higher temperatures at which GST transitions, typically in the 600-700° C. range.

Electrical conductive barrier layer 70 is typically TiN, although other electrical contact enhancement materials such as TaAlN, WAlN or TiAlN may also be used.

The above descriptions may have used terms such as above, below, top, bottom, over, under, et cetera. These terms are used to aid understanding of the invention are not used in a limiting sense.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

Any and all patents, patent applications and printed publications referred to above are hereby incorporated by reference.

What is claimed is:

1. A memory cell comprising:
   a memory cell access layer comprising a bottom electrode; and
   a memory cell layer over the memory cell access layer, the memory cell layer comprising:

a dielectric layer;

a side electrode over the dielectric layer;

the side electrode and the dielectric layer at least partially defining a void; and a memory element within the void, the memory element comprising a memory material switchable between electrical property states by the application of energy, the memory element being in electrical contact with the side electrode and in direct contact with the bottom electrode.

2. The memory cell according to claim 1 wherein the memory element is in direct contact with the side electrode.

3. The memory cell according to claim 1 wherein the side electrode at least partially surrounds and is in contact with a first portion of the memory element.

4. The memory cell according to claim 3 wherein the first portion of the memory element comprises a first outer peripheral surface and the side electrode circumscribes and contacts the first outer peripheral surface of the memory element.

5. The memory cell according to claim 1 wherein a portion of the dielectric layer at least partially surrounds the memory element, said portion being in direct contact with a first portion of the memory element.

6. The memory cell according to claim 5 wherein the first portion of the memory element comprises a phase change material, the memory element having a phase transition region within the first portion.

7. The memory cell according to claim 1 wherein the dielectric layer completely circumscribes and is in direct contact with the memory element.

8. The memory cell according to claim 1 wherein the memory element has a pillar shape with a generally constant lateral dimension.

9. A memory cell device comprising:

a memory cell made according to claim 1; and a bit line electrically connected to the side electrode.

10. The memory cell device according to claim 9 further comprising an electrically conductive barrier electrically connecting the side electrode and the bit line.

11. The memory cell according to claim 1 wherein:

the memory element has a bottom surface and the bottom electrode has a top surface;

the bottom surface is in direct contact with the top surface; and the top surface of the bottom electrode is larger than the bottom surface of the memory element.

12. A memory cell comprising:

a memory cell access layer comprising a bottom electrode; and a memory cell layer over the memory cell access layer, the memory cell layer comprising:

a dielectric layer;

a side electrode over the dielectric layer;

the side electrode and the dielectric layer at least partially defining a void; and a memory element within the void, the memory element comprising a memory material switchable between electrical property states by the application of energy, the memory element being in electrical contact with the side electrode and in direct contact with the bottom electrode and having a pillar shape with a generally constant lateral dimension;

the side electrode surrounding and in contact with a first portion of the memory element;

the dielectric layer surrounding and in contact with a second portion of the memory element; and the second portion of the memory element comprising a phase change material, the memory element having a phase transition region within the second region.

13. The memory cell according to claim 12 wherein:

the memory element has a bottom surface and the bottom electrode has a top surface;

the bottom surface is in direct contact with the top surface; and the top surface of the bottom electrode is larger than the bottom surface of the memory element.

14. A method for manufacturing a memory cell comprising:

providing a memory cell access layer comprising a bottom electrode;

depositing a first dielectric layer onto the memory cell access layer;

depositing a layer of a side electrode material onto the first dielectric layer;

forming a void through the side electrode material and the first dielectric layer to expose the bottom electrode and to create a side electrode element; and creating a memory element in the hole in electrical contact with the side electrode element and in direct contact with the bottom electrode, the memory element comprising a memory material switchable between electrical property states by the application of energy.

15. The method according to claim 14 wherein the forming and creating steps are carried out so that the memory element comprises an outer peripheral surface and the side electrode element circumscribes and contacts the outer peripheral surface of the memory element.

16. The method according to claim 14 wherein the hole forming step comprises:

depositing a supplemental layer onto the layer of the side electrode material;

forming an opening in the supplemental layer aligned with the bottom electrode;

depositing a material into the opening to create a reduced diameter opening therein;

creating a small diameter pore aligned with the reduced diameter opening, the small diameter pore extending to the side electrode element; and removing the supplemental layer.

17. A method for manufacturing a memory cell device comprising:

manufacturing memory cell made according to claim 14; and forming a bit line over and electrically connected to the side electrode element.

18. The memory cell device according to claim 17 further comprising forming an electrically conductive barrier between the bit line and the side electrode element.

19. The method according to claim 14 wherein:

the providing step comprises providing a memory cell access layer having a bottom electrode with a top surface; and the void forming and memory element creating steps are carried out to create a memory element having a bottom surface with the top surface of the bottom electrode being larger than the bottom surface of the memory element.

* * * * *